United States Patent
Hsu (10) Patent No.: US 8,001,170 B2
(45) Date of Patent: Aug. 16, 2011

(54) EQUALIZER SYSTEM AND FILTERING METHOD

(75) Inventor: Kuang-Hui Hsu, Taichung (TW)

(73) Assignee: Mediatek Inc., Hsin-Chu (TW)

( * ) Notice: Subject to any disclaimer, the term of this patent is extended or adjusted under 35 U.S.C. 154(b) by 1019 days.

(21) Appl. No.: 11/848,292

(22) Filed: Aug. 31, 2007

(65) Prior Publication Data
US 2009/0060019 A1    Mar. 5, 2009

(51) Int. Cl.
*G06F 17/10* (2006.01)
(52) U.S. Cl. .......................................... 708/323
(58) Field of Classification Search ........... 708/322–323
See application file for complete search history.

(56) References Cited

U.S. PATENT DOCUMENTS

| | | | |
|---|---|---|---|
| 4,939,782 A | 7/1990 | Gambacurta, Jr. et al. | |
| 5,400,247 A | 3/1995 | He | |
| 5,524,022 A | 6/1996 | Kihara et al. | |
| 5,530,660 A | 6/1996 | Sun et al. | |
| 5,687,104 A | 11/1997 | Lane et al. | |
| 5,714,918 A | 2/1998 | Menkhoff | |
| 5,737,254 A | 4/1998 | Lane et al. | |
| 6,839,016 B2 * | 1/2005 | Roza | 341/161 |
| 7,865,269 B2 * | 1/2011 | Prisco et al. | 700/264 |

* cited by examiner

Primary Examiner — Tan V Mai
(74) Attorney, Agent, or Firm — Thomas|Kayden (57) ABSTRACT

An equalizer system comprises a gain adjuster and a filter system. The gain adjuster provides a plurality of gain settings. The filter system is coupled to the gain adjuster and filters an input signal to output a filtered signal in response to the gain settings. The filter system comprises at least one high shelving filter with a first transfer function and at least one low shelving filter with a second transfer function. The reciprocal of the first transfer function is equal to the second transfer function.

20 Claims, 7 Drawing Sheets

EQUALIZER SYSTEM AND FILTERING METHOD

BACKGROUND OF THE INVENTION

1. Field of the Invention

The invention relates to an equalizer, and in particular relates to an audio graphic equalizer.

2. Description of the Related Art

A graphic equalizer typically comprises a number of band pass filtering functions residing in bands across a frequency spectrum. In the case of a graphic equalizer operating on audio signals, the frequency spectrum extends from a lower end of about 20 hertz (Hz) to an upper end of around 20,000 Hz; a spectrum comprising a typical person's audible range. A typical graphic equalizer segments the frequency band into a number of bands with center frequencies and boundary frequencies. For each of these bands, the graphic equalizer will either boost the signal or cut the signal, depending upon user inputs. By selectively varying the magnitude of an audio signal across the frequency band, the graphic equalizer may be used to reduce noise components, compensate for acoustical shortcomings, and even be used to compensate for user preferences in signal production. Acoustical shortcomings may include non-ideal room acoustics, amplifiers, microphones, and music reproduction equipment such as record and audio cassette tape players.

However, the filtering characteristics of a graphic equalizer often distort desired control parameters provided by a user and cause the graphic equalizer to have a filter function that does not accurately represent the desired control parameters. Meanwhile, each of the band pass filters not only varies signals in its own band but also adjacent bands. Because of the interband effect the band pass filters have on adjacent bands, the performance of all the bands becomes skewed. The interband effect the band pass filters have on adjacent bands is often called band coupling. Band coupling often results in greatly exaggerated or reduced filter performances in a particular band as compared to user input settings. The frequency response is not desired and distorted.

BRIEF SUMMARY OF THE INVENTION

A detailed description is given in the following embodiments with reference to the accompanying drawings.

An embodiment of a method for filtering an input signal to generate a filtered signal is provided. The method comprises: receiving a plurality of gain settings and filtering the input signal with a filter system to provide the filtered signal in response to the gain settings. The filter system comprises at least one high shelving filter with a first transfer function and at least one low shelving filter with a second transfer function. A reciprocal of the first transfer function is equal to the second transfer function.

Another embodiment of an equalizer system is provided. The equalizer system comprises a gain adjuster and a filter system. The gain adjuster provides a plurality of gain settings. The filter system is coupled to the gain adjuster and filters an input signal to output a filtered signal in response to the gain settings. The filter system comprises at least one high shelving filter with a first transfer function and at least one low shelving filter with a second transfer function. A reciprocal of the first transfer function is equal to the second transfer function.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
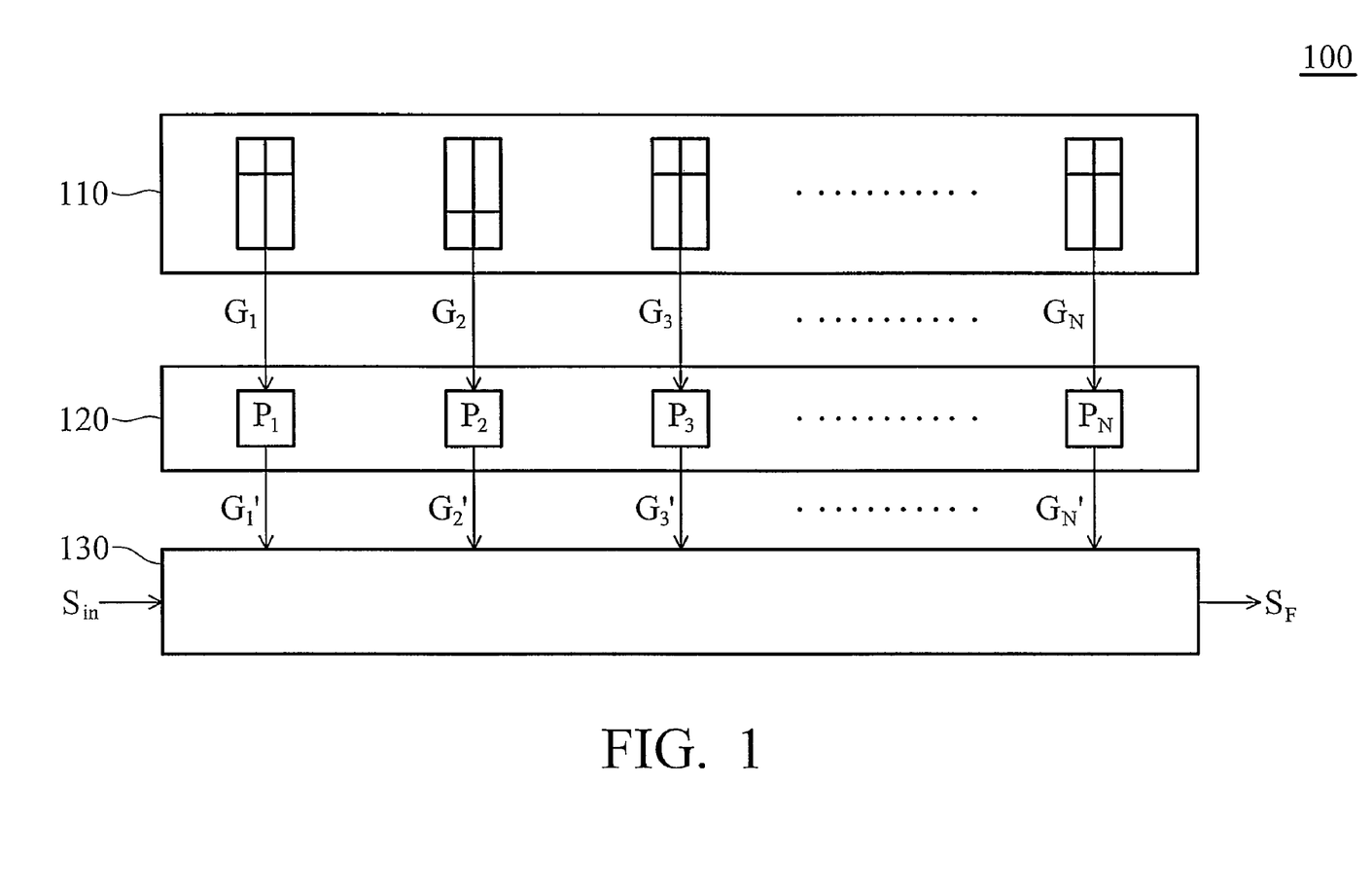
FIG. 1 is a schematic diagram of an equalizer system according to an embodiment of the invention.

FIG. 1 is a schematic diagram of an equalizer system 100 according to an embodiment of the invention. Equalizer system 100 comprises gain adjuster 110, gain adapter 120 and filter system 130. Gain adjuster 110 outputs user gain settings ($G_1$, $G_2$, $G_3$, ... $G_N$) dependant on the user setting. Due to overshoot phenomenon of filters, gain adapter 120 adjusts gain settings ($G_1$, $G_2$, $G_3$, ... $G_N$) to output gain signals ($G_1'$, $G_2'$, $G_3'$, ... $G_N'$) for compensating quality factors (Q) to avoid frequency response overshooting phenomenon according to quality factor settings of equalizer system 100. It is noted designers may modify the number of gain settings according to design necessity and the number of filters utilized in the filter system 130. Filter system 130 comprises at least one low shelving filter (LSF) and at least one high shelving filter (HSF). Filter system 130 receives input signal $S_{in}$ and filters input signal $S_{in}$ to output filtered signal $S_F$ according to gain signals ($G_1'$, $G_2'$, $G_3'$, ... $G_N'$). Various exemplary embodiments for the filter system 130 are described in the following. Those skilled in the art may further modify the embodiments for the filter system 130 in accordance with desired functions based on the descriptions.

Equalizer system 100 can be used in a digital audio system or analog audio system, such as a PDA, cell phone, MP3 player, digital TV or LCD TV.

Figure 2:
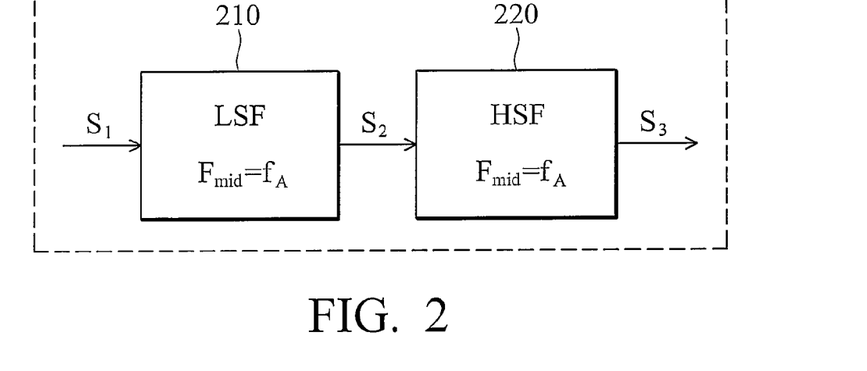
FIG. 2 is a first exemplary embodiment of the filter system comprising low shelving filter cascaded by high shelving filter according to another embodiment of the invention.

FIG. 2 is a first exemplary embodiment of the filter system 130 comprising low shelving filter 210 cascaded by high shelving filter 220 according to another embodiment of the invention. Low shelving filter 210 and high shelving filter 220 comprise the same middle frequency $f_A$. Middle frequency is a frequency corresponding to the middle gain magnitude for low shelving filter response or high shelving filter response. The transfer function of high shelving filter 220 is $$T_H(s) = A \frac{AS^2 + (\sqrt{A}/Q)S + 1}{S^2 + (\sqrt{A}/Q)S + A} \quad (A = 1 \text{ results in } T_H(s) = 1].$$

The transfer function of low shelving filter 210 is $$T_L(s) = A \frac{S^2 + (\sqrt{A}/Q)S + A}{AS^2 + (\sqrt{A}/Q)S + 1} \quad (A = 1 \text{ results in } T_H(s) = 1).$$

The reciprocal of the transfer function of high shelving filter 220 equals to the transfer function of low shelving filter 210. The magnitude of low shelving filter 220, A, is determined according to the gain signals ($G_1'$, $G_2'$, $G_3'$, ... $G_N'$), wherein if the gain signals ($G_1'$, $G_2'$, $G_3'$, ... $G_N'$) are linear scale, $A = \sqrt{G_i'}$ where i is an integer and ranges between 1 to N. It is noted that if gain signals ($G_1'$, $G_2'$, $G_3'$, ... $G_N'$) are dB scale values, scale conversion is required that $A = \sqrt{10^{G_i'/20}}$, wehre i is an integer and ranges between 1 to N. The relationship between quality factor Q and shelving slope $S_p$ is $$\frac{1}{Q} = \sqrt{\left(A + \frac{1}{A}\right)\left(\frac{1}{S_p} - 1\right) + 2}.$$

Low shelving filter 210 filters input signal $S_1$ to output filtered signal $S_2$ and high shelving filter 220 receives filtered signal $S_2$ to output output signal $S_3$. It is not limited that low shelving filter is cascaded by high shelving filter 220. High shelving filter 220 can be also cascaded by low shelving filter 210. The frequency responses of two cascaded combinations are the same.

The biquad transfer function (digital transfer function) of low shelving filter 210 is $$T_{Ld}(s) = \frac{b_0 + b_1 Z^{-1} + b_2 Z^{-2}}{a_0 + a_1 Z^{-1} + a_2 Z^{-2}}.$$

The parameters for low shelving filter 210 are $b_0 = A*((A+1)-(A-1)\cos(W0)+2\sqrt{A}\sin(W0)/(2Q))$, $b_1 = 2A((A-1)-(A+1)\cos(W0))$, $b_2 = A((A+1)-(A-1)\cos(W0)-2\sqrt{A}\sin(w0)/(2Q))$, $a_0 = (A+1)+(A-1)\cos(W0)+2\sqrt{A}\sin(W0)/(2Q)$, $a_1 = -2((A-1)+(A+1)\cos(W0))$, $a_2 = (A+1)+(A-1)\cos(W0)-2\sqrt{A}\sin(w0)/(2Q)$.

The biquad transfer function (digital transfer function) of high shelving filter 220 is $$T_{Hd}(z) = \frac{b_0 + b_1 Z^{-1} + b_2 Z^{-2}}{a_0 + a_1 Z^{-1} + a_2 Z^{-2}}.$$

The parameters for high shelving filter 220 are $b_0 = A*((A+1)+(A-1)\cos(W0)+2\sqrt{A}\sin(W0)/(2Q))$, $b_1 = -2A((A-1)+(A+1)\cos(W0))$, $b_2 = A((A+1)+(A-1)\cos(W0)-2\sqrt{A}\sin(w0)/(2Q))$, $a_0 = (A+1)-(A-1)\cos(W0)+2\sqrt{A}\sin(W0)/(2Q)$, $a_1 = 2((A-1)-(A+1)\cos(W0))$, $a_2 = (A+1)-(A-1)\cos(W0)-2\sqrt{A}\sin(w0)/(2Q)$.

Figure 3:
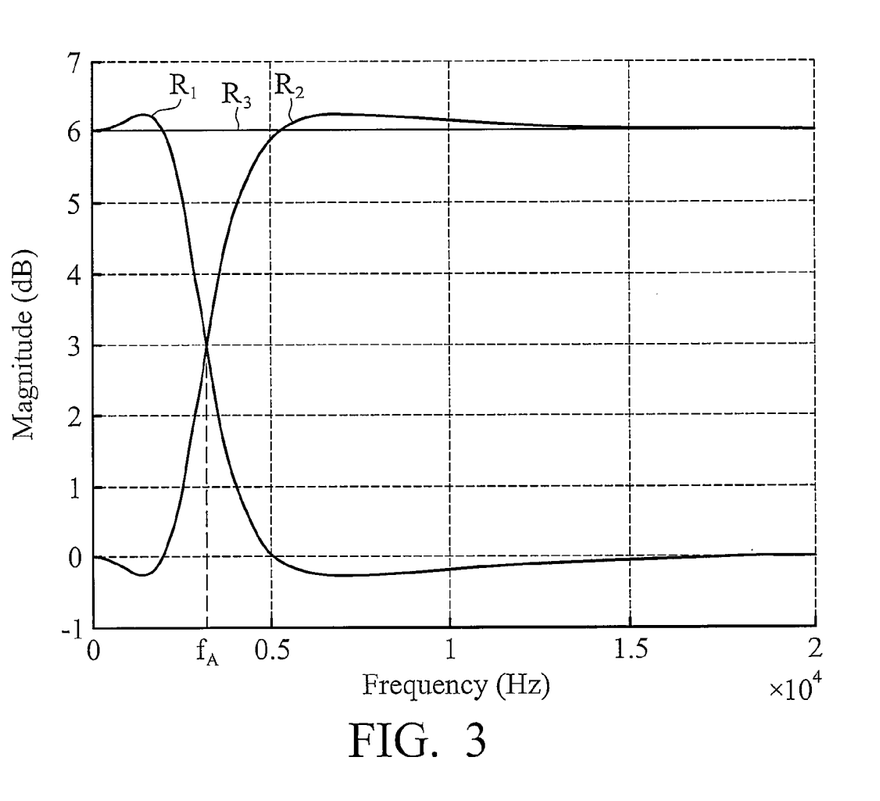
FIG. 3 is a frequency response of the low shelving filter cascaded by the high shelving filter in FIG. 2.

FIG. 3 is a frequency response of low shelving filter 210 cascaded by high shelving filter 220 in FIG. 2. Low shelving filter response $R_1$ is derived by output signal $S_2$ and input signal $S_1$. High shelving filter response $R_2$ is derived by output signal $S_3$ and input signal $S_2$. Cascaded frequency response $R_3$ is derived by output signal $S_3$ and input signal $S_1$. Cascaded frequency response $R_3$ is also the production of high shelving filter response $R_2$ and low shelving filter response $R_1$. It is noted that the cascaded frequency response $R_3$ is a plane or smooth frequency response without a ripple because the transfer functions of low shelving filter 210 and high shelving filter 220 are reversed except for magnitude A. The low shelving filter response $R_1$ and high shelving filter response $R_2$ are anti-symmetric.

Figure 4:
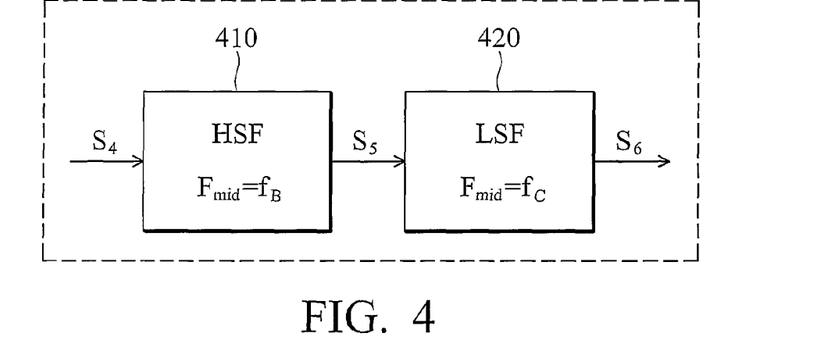
FIG. 4 is a second exemplary embodiment of the filter system comprising a high shelving filter cascaded by a low shelving filter according to another embodiment of the invention.

FIG. 4 is a second exemplary embodiment of the filter system 130 comprising high shelving filter 410 cascaded by low shelving filter 420 according to another embodiment of the invention. The transfer functions of high shelving filter 410 and low shelving filter 420 are the same as those of high shelving filter 220 and low shelving filter 210 in FIG. 2. However, high shelving filter 410 comprises middle frequency $f_B$ and low shelving filter 420 comprises a different middle frequency $f_C$. High shelving filter 410 and low shelving filter 420 form a new band pass filter. The frequency responses of high shelving filter 410 and low shelving filter 420 are biased by −gain/2. For example, the gain magnitude of the band pass filter is 6 dB. Each gain magnitude of high shelving filter 410 and low shelving filter 420 are shifted by −3 dB (−6/2). For instance, the original magnitude of the frequency response of high shelving filter 410 at 0 Hz is 0 dB, and thus should be shifted to −3 dB to form a bandpass filter with the high shelving filter 420.

Figure 5:
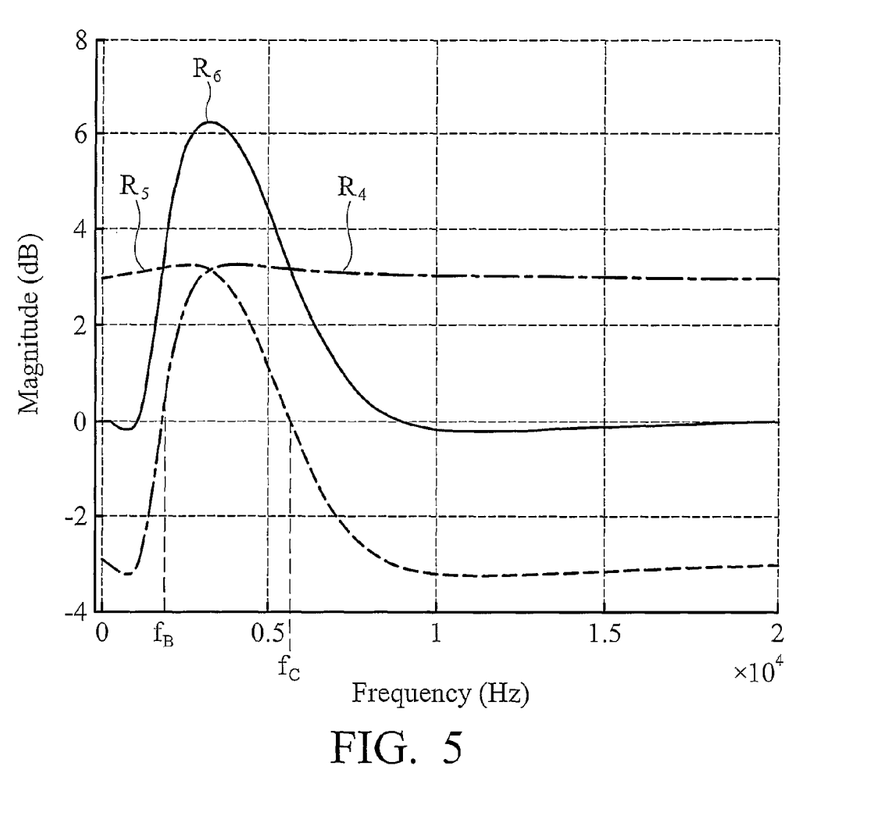
FIG. 5 is a frequency response of the high shelving filter cascaded by the low shelving filter in FIG. 4.

FIG. 5 is a frequency response of high shelving filter 410 cascaded by low shelving filter 420 in FIG. 4. High shelving filter response $R_4$ is derived by output signal $S_5$ and input signal $S_4$. Low shelving filter response $R_5$ is derived by output signal $S_6$ and input signal $S_5$. Cascaded frequency response $R_6$ is derived by output signal $S_6$ and input signal $S_4$. Cascaded frequency response $R_6$ is also the production of high shelving filter response $R_4$ and low shelving filter response $R_5$. It is noted that the transfer functions of low shelving filter 420 and high shelving filter 410 are reversed except for magnitude A.

Figure 6:
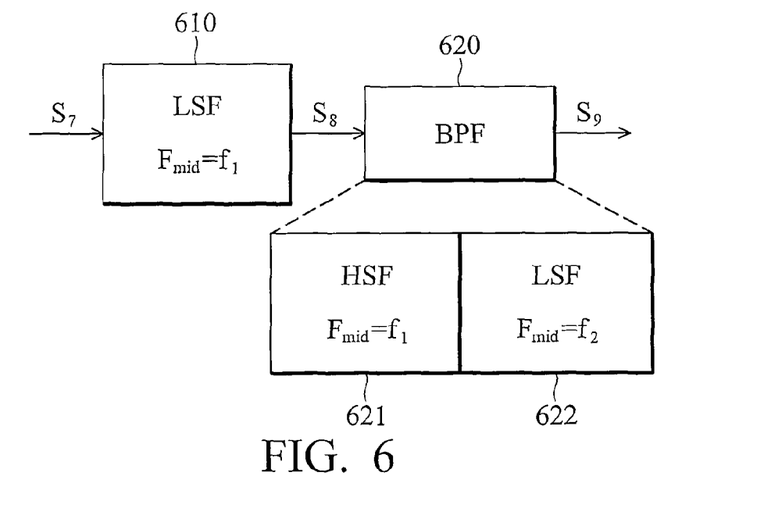
FIG. 6 is a third exemplary embodiment of the filter system comprising a low shelving filter cascaded by a band pass filter according to another embodiment of the invention.

FIG. 6 is a third exemplary embodiment of the filter system 130 comprising low shelving filter 610 cascaded by band pass filter 620 according to another embodiment of the invention. Band pass filter 620 comprises high shelving filter 621 and low shelving filter 622. The transfer functions of high shelving filter 621 and low shelving filters 610 and 622 are the same as those of high shelving filter 220 and low shelving filter 210 in FIG. 2. Low shelving filter 610 comprises middle frequency $f_1$ and high shelving filter 621 comprises the same middle frequency $f_1$. Low shelving filter 622 comprises middle frequency $f_2$.

Figure 7:
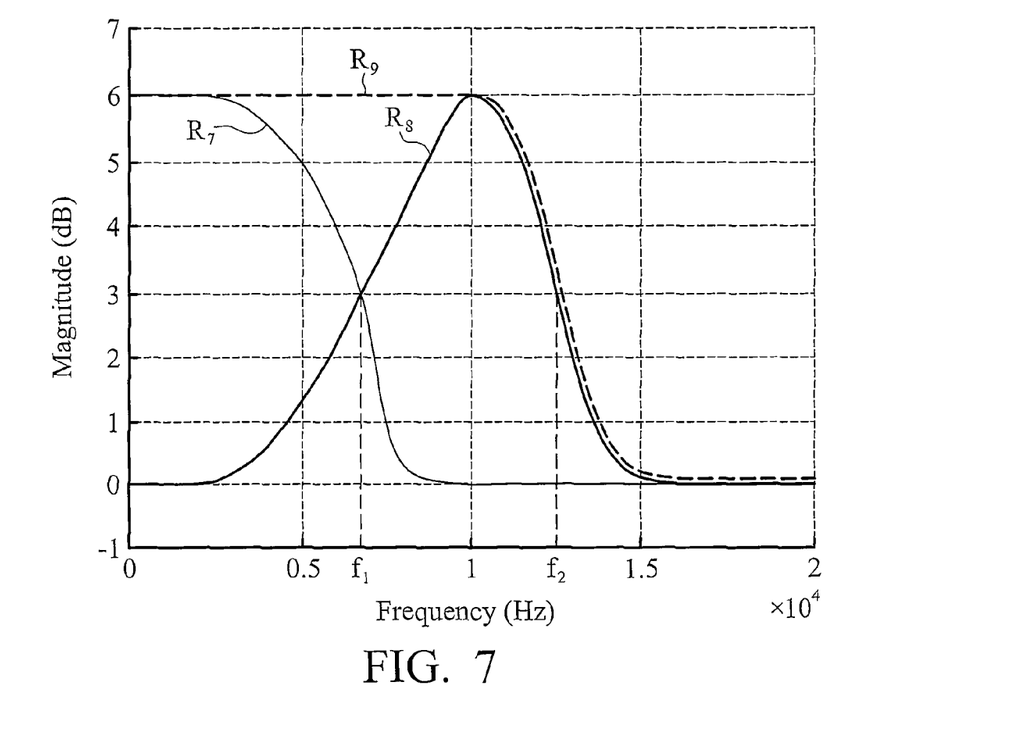
FIG. 7 is a frequency response of the low shelving filter cascaded by the band pass filter in FIG. 6.

FIG. 7 is a frequency response of low shelving filter 610 cascaded by band pass filter 620 in FIG. 6. Low shelving filter response $R_7$ is derived by output signal $S_8$ and input signal $S_7$. Band pass filter response $R_8$ is derived by output signal $S_9$ and input signal $S_8$. Cascaded frequency response $R_9$ is derived by output signal $S_9$ and input signal $S_7$. As shown in FIG. 7, cascaded frequency response $R_9$ is a smooth response without any ripple because the transfer functions of low shelving filter 610 and high shelving filter 621 are reversed except magnitude A. Cascaded frequency response $R_9$ is also the production of low shelving filter response $R_7$ and band pass filter response $R_8$.

Figure 8:
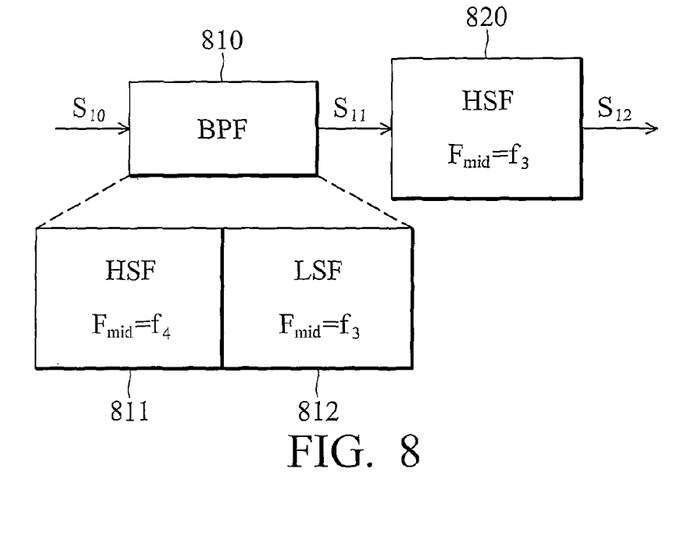
FIG. 8 is a fourth exemplary embodiment of the filter system comprising a band pass filter cascaded by a high shelving filter according to another embodiment of the invention.

FIG. 8 is a fourth exemplary embodiment of the filter system 130 comprising band pass filter 810 cascaded by high shelving filter 820 according to another embodiment of the invention. Band pass filter 810 comprises high shelving filter 811 and low shelving filter 812. The transfer functions of high shelving filters 811 and 820 and low shelving filter 812 are the same as those of high shelving filter 220 and low shelving filter 210 in FIG. 2. Low shelving filter 812 comprises middle frequency $f_3$ and high shelving filter 820 comprises the same middle frequency $f_3$. High shelving filter 811 comprises middle frequency $f_4$.

Figure 9:
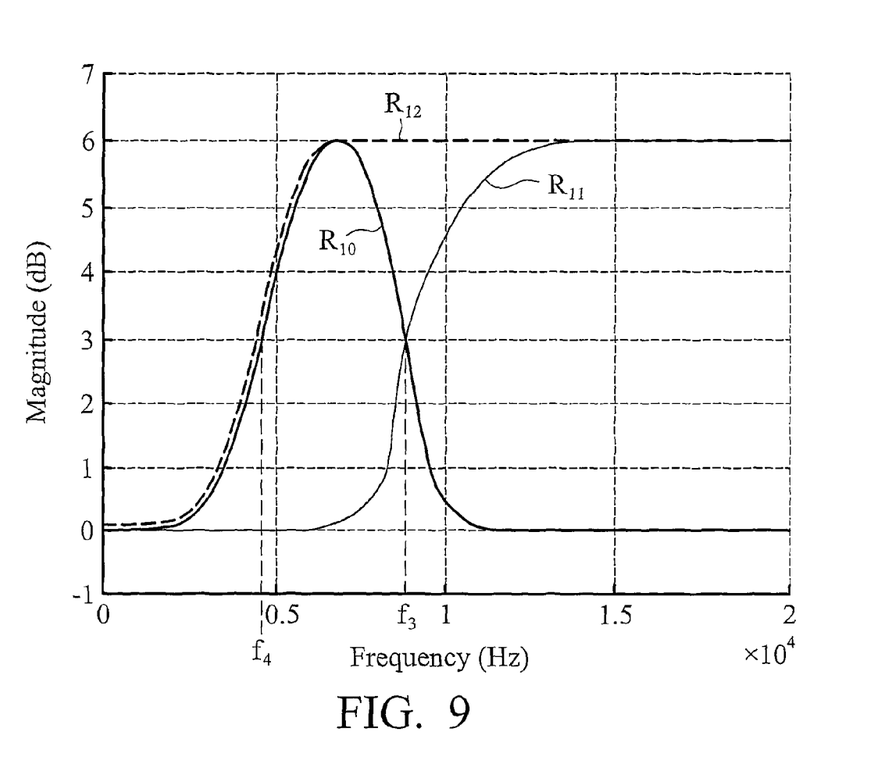
FIG. 9 is a frequency response of the band pass filter cascaded by the high shelving filter in FIG. 8.

FIG. 9 is a frequency response of band pass filter 810 cascaded by high shelving filter 820 in FIG. 8. Band pass filter response $R_{10}$ is derived by output signal $S_{11}$ and input signal $S_{10}$. High shelving filter response $R_{11}$ is derived by output signal $S_{12}$ and input signal $S_{11}$. Cascaded frequency response $R_{12}$ is derived by output signal $S_{12}$ and input signal $S_{10}$. Cascaded frequency response $R_{12}$ is also the production of high shelving filter response $R_{11}$ and band pass filter response $R_{10}$. As shown in FIG. 9, cascaded frequency response $R_{12}$ is a smooth response without any ripple because the transfer functions of low shelving filter 812 and high shelving filter 820 are reversed except magnitude A.

Figure 10:
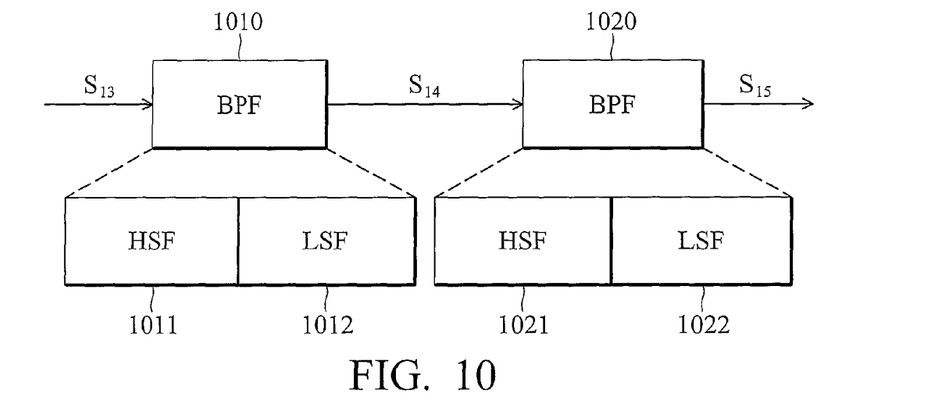
FIG. 10 is a fifth exemplary embodiment of the filter system comprising a band pass filter cascaded by a band pass filter according to another embodiment of the invention.

FIG. 10 is a fifth exemplary embodiment of the filter system 130 comprising band pass filter 1010 cascaded by band pass filter 1020 according to another embodiment of the invention. Band pass filter 1010 comprises high shelving filter 1011 and low shelving filter 1012. Band pass filter 1020 comprises high shelving filter 1021 and low shelving filter 1022. The transfer functions of high shelving filters 1011 and 1021 and low shelving filters 1012 and 1022 are the same as those of high shelving filter 220 and low shelving filter 210 in FIG. 2. Low shelving filter 1012 comprises middle frequency $f_5$ and high shelving filter 1021 comprises the same middle frequency $f_5$. High shelving filter 1011 comprises middle frequency $f_7$. Low shelving filter 1022 comprises middle frequency $f_6$.

Figure 11:
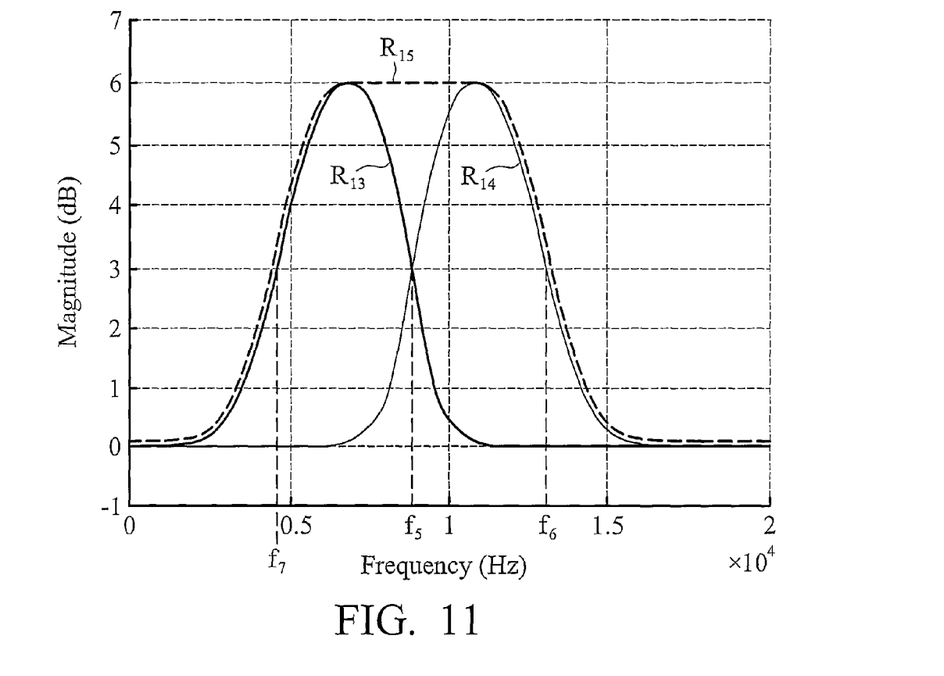
FIG. 11 is a frequency response of the band pass filter cascaded by the band pass filter in FIG. 10.

FIG. 11 is a frequency response of band pass filter 1010 cascaded by band pass filter 1020 in FIG. 10. Band pass filter response $R_{13}$ is derived by output signal $S_{14}$ and input signal $S_{13}$. Band pass filter response $R_{14}$ is derived by output signal $S_{15}$ and input signal $S_{14}$. Cascaded frequency response $R_{15}$ is derived by output signal $S_{15}$ and input signal $S_{13}$. Cascaded frequency response $R_{15}$ is also the production of Band pass filter response $R_{13}$ and band pass filter response $R_{14}$. It is noted that the transfer functions of low shelving filter 1012 and high shelving filter 1021 are reversed except magnitude A. Thus, cascaded frequency response $R_{15}$ is a smooth response without any ripple.

Figure 12:
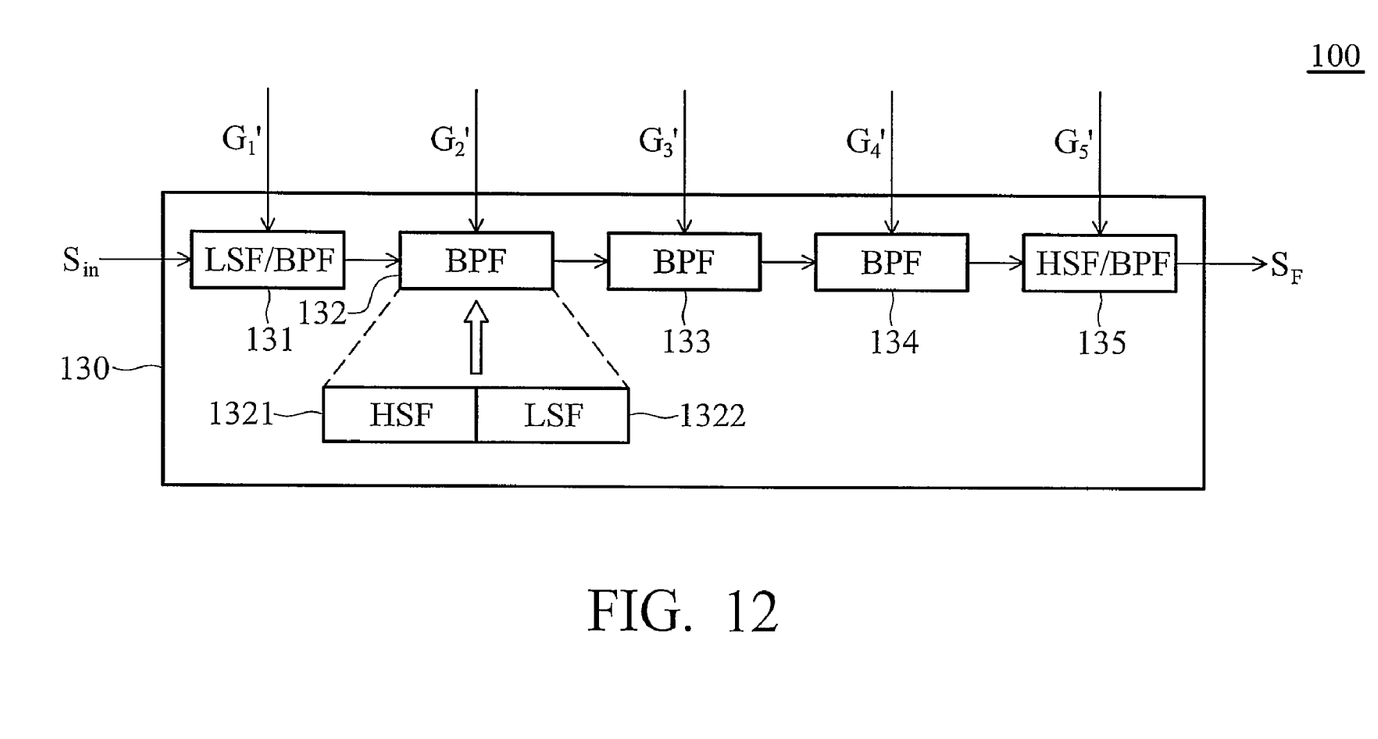
FIG. 12 shows a sixth embodiment of the filter system according to another embodiment of the invention.

The transfer functions of low shelving filter and high shelving filter are not limited to two order polynomial. The transfer functions can be more than two orders. The low shelving filter and high shelving filter with a same middle frequency are coupled in series to form a plane or smooth frequency response without ripples as shown in FIG. 3. Moreover, the filter system 130 is not limited to the described embodiments; designers may modify or combine the described embodiments to obtain a desired frequency response. FIG. 12 shows a sixth embodiment of the filter system 130 according to another embodiment of the invention. Filter system 130 receives input signal $S_{in}$ and filters input signal $S_{in}$ with LSF/BPF 131, BPFs 132, 133 and 134 and HSF/BPF 135 coupled in series to output filtered signal $S_F$ according to gain signals $(G_1', G_2', G_3', \ldots G_5')$. The filter 131 may be either a LSF or a BPF. Similarly, filter 135 may be either a HSF or a BPF. If filter system 130 is composed of LSF 131, BPFs 132, 133 and 134 and HSF 135, the frequency response of filter system 130 is similar to the frequency response as shown in FIG. 3. If filter system 130 is composed of BPF 131, BPFs 132, 133 and 134 and BPF 135, the frequency response of filter system 130 is similar to the frequency response as shown in FIG. 11. Each band pass filter 132, 133 and 134 comprises one LSF and one HSF. For example, BPF 132 comprises HSF 1321 and LSF 1322. It is noted that a reciprocal of the transfer function of LSF is equal to the transfer function of following HSF. The properties and functions of LSF/BPF 131, BPFs 132, 133 and 134 and HSF/BPF 135 are similar to those described in FIGS. 2~11. Those skilled in the art may be able to realize how the sixth embodiment provides a desired frequency response based on the above descriptions. Therefore, the descriptions for these operations and functions are not repeated herein.

While the invention has been described by way of example and in terms of preferred embodiment, it is to be understood that the invention is not limited to thereto. To contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for filtering an input signal to generate a filtered signal, comprising:
receiving a plurality of gain settings; and
filtering the input signal with a filter system to provide the filtered signal in response to the gain settings, wherein the filter system comprises at least one high shelving filter with a first transfer function, at least one low shelving filter with a second transfer function, and a reciprocal of the first transfer function is equal to the second transfer function, the at least one high and low shelving filters cascaded relative to one another such that the output of one comprises the input to the other.

2. The method as claimed in claim 1, wherein the first transfer function is $$T_H(s) = \frac{AS^2 + (\sqrt{A}/Q)S + 1}{S^2 + (\sqrt{A}/Q)S + A}$$

and a quality factor is $$\frac{1}{Q} = \sqrt{\left(A + \frac{1}{A}\right)\left(\frac{1}{S} - 1\right) + 2},$$

where A is a magnitude of the first transfer function.

3. The method as claimed in claim 1, wherein the second transfer function is $$T_L(s) = \frac{S^2 + (\sqrt{A}/Q)S + A}{AS^2 + (\sqrt{A}/Q)S + 1}$$

and a quality factor is $$\frac{1}{Q} = \sqrt{\left(A + \frac{1}{A}\right)\left(\frac{1}{S} - 1\right) + 2},$$

where A is a magnitude of the second transfer function.

4. The method as claimed in claim 3, wherein the second transfer function is $$T_{Ld}(z) = \frac{b_0 + b_1 Z^{-1} + b_2 Z^{-2}}{a_0 + a_1 Z^{-1} + a_2 Z^{-2}},$$

and parameters are $b_0 = A^*((A+1)-(A-1)\cos(W0)+2\sqrt{A}\sin(W0)/(2Q))$, $b_1 = 2A((A-1)-(A+1)\cos(W0))$, $b_2 = A((A+1)-(A-1)\cos(W0)-2\sqrt{A}\sin(w0)/(2Q))$, $a_0 = (A+1)+(A-1)\cos(W0)+2\sqrt{A}\sin(W0)/(2Q)$, $a_1 = -2((A-1)+(A+1)\cos(W0))$, $a_2 = (A+1)+(A-1)\cos(W0)-2\sqrt{A}\sin(w0)/(2Q)$.

5. The method as claimed in claim 1, wherein the first transfer function is $$T_{Hd}(z) = \frac{b_0 + b_1 Z^{-1} + b_2 Z^{-2}}{a_0 + a_1 Z^{-1} + a_2 Z^{-2}},$$

and parameters are, $b_0 = A^*((A+1)+(A-1)\cos(W0)+2\sqrt{A}\sin(W0)/(2Q))$, $b_1 = -2A((A-1)+(A+1)\cos(W0))$, $b_2 = A((A+1)+(A-1)\cos(W0)-2\sqrt{A}\sin(w0)/(2Q))$, $a_0 = (A+1)-(A-1)\cos(W0)+2\sqrt{A}\sin(W0)/(2Q)$, $a_1 = 2((A-1)-(A+1)\cos(W0))$, and $a_2 = (A+1)-(A-1)\cos(W0)-2\sqrt{A}\sin(w0)/(2Q)$.

6. The method as claimed in claim 1, wherein the low shelving filter and the high shelving filter with a same middle frequency are coupled in series to generate a desired frequency response.

7. The equalizer system as claimed in claim 1, wherein the filter system comprises a first low shelving filter with a first middle frequency, a high shelving filter with the first middle frequency and a second low shelving filter with a second middle frequency, and the first low shelving filter, high shelving filter and second low shelving filter are coupled in series.

8. The method as claimed in claim 1, wherein the filter system comprises a first high shelving filter with a third middle frequency, a low shelving filter with the third middle frequency and a second high shelving filter with a fourth middle frequency, and the first high shelving filter, low shelving filter, and second high shelving filter are coupled in series.

9. The method as claimed in claim 1, wherein the filter system comprises a first high shelving filter with a fifth middle frequency, a first low shelving filter with a sixth middle frequency, a second high shelving filter with the sixth middle frequency and a second low shelving filter with a seventh middle frequency, and the first high shelving filter, first low shelving filter, second high shelving filter, and second low shelving filter are coupled in series.

10. An equalizer system, comprising:
a gain adjuster providing a plurality of gain settings; and
a filter system coupled to the gain adjuster, filtering an input signal to output a filtered signal in response to the gain settings, the filter system comprising:
at least one high shelving filter with a first transfer function; and
at least one low shelving filter with a second transfer function;
wherein a reciprocal of the first transfer function is equal to the second transfer function,
wherein the at least one high and low shelving filters are cascaded relative to one another such that the output of one comprises the input to the other.

11. The equalizer system as claimed in claim 10, wherein the first transfer function is $$T_H(s) = \frac{AS^2 + (\sqrt{A}/Q)S + 1}{S^2 + (\sqrt{A}/Q)S + A}$$

and a quality factor is $$\frac{1}{Q} = \sqrt{\left(A + \frac{1}{A}\right)\left(\frac{1}{S} - 1\right) + 2},$$

where A is a magnitude of the first transfer function.

12. The equalizer system as claimed in claim 11, wherein the first transfer function for is $$T_{Hd}(z) = \frac{b_0 + b_1 Z^{-1} + b_2 Z^{-2}}{a_0 + a_1 Z^{-1} + a_2 Z^{-2}},$$

and parameters are, $b_0 = A^*((A+1)+(A-1)\cos(W0)+2\sqrt{A}\sin(W0)/(2Q))$, $b_1 = -2A((A-1)+(A+1)\cos(W0))$, $b_2 = A((A+1)+(A-1)\cos(W0)-2\sqrt{A}\sin(w0)/(2Q))$, $a_0 = (A+1)-(A-1)\cos(W0)+2\sqrt{A}\sin(W0)/(2Q)$, $a_1 = 2((A-1)-(A+1)\cos(W0))$, and $a_2 = (A+1)-(A-1)\cos(W0)-2\sqrt{A}\sin(w0)/(2Q)$.

13. The equalizer system as claimed in claim 10, wherein the second transfer function is $$T_L(s) = \frac{S^2 + (\sqrt{A}/Q)S + A}{AS^2 + (\sqrt{A}/Q)S + 1}$$

and a quality factor is $$\frac{1}{Q} = \sqrt{\left(A + \frac{1}{A}\right)\left(\frac{1}{S} - 1\right) + 2},$$

where A is a magnitude of the second transfer function.

14. The equalizer system as claimed in claim 13, wherein the second transfer function is $$T_{Ld}(z) = \frac{b_0 + b_1 Z^{-1} + b_2 Z^{-2}}{a_0 + a_1 Z^{-1} + a_2 Z^{-2}},$$

and parameters are $b_0 = A*((A+1)-(A-1)\cos(W0)+2\sqrt{A}\sin(W0)/(2Q))$, $b_1 = 2A((A-1)-(A+1)\cos(W0))$, $b_2 = A((A+1)-(A-1)\cos(W0)-2\sqrt{A}\sin(w0)/(2Q))$, $a_0 = (A+1)+(A-1)\cos(W0)+2\sqrt{A}\sin(W0)/(2Q)$, $a_1 = -2((A-1)+(A+1)\cos(W0))$, $a_2 = (A+1)+(A-1)\cos(W0)-2\sqrt{A}\sin(w0)/(2Q)$.

15. The equalizer system as claimed in claim 10, wherein the low shelving filter and the high shelving filter with a same middle frequency are coupled in series to generate a desired frequency response.

16. The equalizer system as claimed in claim 10, wherein the filter system comprises a first low shelving filter with a first middle frequency, a high shelving filter with the first middle frequency and a second low shelving filter with a second middle frequency, and the first low shelving filter, high shelving filter and second low shelving filter are coupled in series.

17. The equalizer system as claimed in claim 10, wherein the filter system comprises a first high shelving filter with a third middle frequency, a low shelving filter with the third middle frequency and a second high shelving filter with a fourth middle frequency, and the first high shelving filter, low shelving filter, and second high shelving filter are coupled in series.

18. The equalizer system as claimed in claim 10, wherein the filter system comprises a first high shelving filter with a fifth middle frequency, a first low shelving filter with a sixth middle frequency, a second high shelving filter with the sixth middle frequency and a second low shelving filter with a seventh middle frequency, and the first high shelving filter, first low shelving filter, second high shelving filter, and second low shelving filter are coupled in series.

19. The equalizer system as claimed in claim 10, further comprising a gain adapter coupled to the gain adjuster, adjusting the gain settings to generate a plurality of gain signals to the filter system.

20. The equalizer system as claimed in claim 10, wherein the equalizer system is a part of a digital audio system, analog audio system, PDA, cell phone, MP3 player, digital TV or LCD TV.

* * * * *